United States Patent
Baggett et al.

(10) Patent No.: US 10,903,097 B2
(45) Date of Patent: Jan. 26, 2021

(54) IN-SITU WAFER TEMPERATURE MEASUREMENT AND CONTROL

(71) Applicant: Axcelis Technologies, Inc., Beverly, MA (US)

(72) Inventors: John F. Baggett, Georgetown, MA (US); Ronald N. Reece, Westwood, MA (US); Petros Miltiades Kopalidis, Swampscott, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 16/367,948

(22) Filed: Mar. 28, 2019

(65) Prior Publication Data

US 2019/0304820 A1 Oct. 3, 2019

Related U.S. Application Data

(60) Provisional application No. 62/650,832, filed on Mar. 30, 2018.

(51) Int. Cl.
*H01L 21/67* (2006.01)
*H01J 37/20* (2006.01)
(Continued)

(52) U.S. Cl.
CPC ........ *H01L 21/67248* (2013.01); *G01K 13/00* (2013.01); *H01J 37/20* (2013.01);
(Continued)

(58) Field of Classification Search
CPC ......... H01L 21/67248; H01L 21/67103; H01L 21/6833; H01L 21/68721; H01J 37/20;
(Continued)

(56) References Cited

U.S. PATENT DOCUMENTS 5,663,899 A * 9/1997 Zvonar .................. G01K 15/00
236/15 BB
2003/0019579 A1* 1/2003 Ahn .................. H01J 37/32834
156/345.29

(Continued)

OTHER PUBLICATIONS

International Search Report and Written Opinion dated Jul. 8, 2019 in connection with International Application No. PCT/US2019/025116.

*Primary Examiner* — David E Smith
(74) *Attorney, Agent, or Firm* — Eschweiler & Potashnik, LLC (57) ABSTRACT

A thermal chuck selectively retains a workpiece on a clamping surface. The thermal chuck has one or more heaters to selectively heat the clamping surface and the workpiece. A thermal monitoring device determines a temperature of a surface of the workpiece when the workpiece resides on the clamping surface, defining one or more measured temperatures. A controller selectively energizes the one or more heaters based on the one or more measured temperatures. The thermal monitoring device may be one or more of a thermocouple or RTD in selective contact with the surface of the workpiece and an emissivity sensor or pyrometer not in contact with the surface. The thermal chuck can be part of an ion implantation system configured to implant ions into the workpiece. The controller can be further configured to control the heaters based on the measured temperatures.

25 Claims, 7 Drawing Sheets

(51) Int. Cl.
*H01J 37/317* (2006.01)
*H01L 21/683* (2006.01)
*H01L 21/687* (2006.01)
*G01K 13/00* (2006.01)

(52) U.S. Cl.
CPC .... *H01J 37/3171* (2013.01); *H01L 21/67103* (2013.01); *H01L 21/6833* (2013.01); *H01L 21/68721* (2013.01); *H01J 2237/2001* (2013.01); *H01J 2237/2007* (2013.01); *H01J 2237/31701* (2013.01)

(58) Field of Classification Search
CPC ........... H01J 37/3171; H01J 2237/2001; H01J 2237/2007; H01J 2237/31701; G01K 13/00
See application file for complete search history.

(56) References Cited

U.S. PATENT DOCUMENTS

| 2006/0183290 | A1* | 8/2006 | Kamada | H01L 22/14 438/300 |
| 2008/0042078 | A1* | 2/2008 | England | H01J 37/20 250/492.21 |
| 2014/0065730 | A1 | 3/2014 | Reece | |
| 2016/0035544 | A1* | 2/2016 | Lubomirsky | H01J 37/32082 156/345.27 |
| 2016/0204000 | A1* | 7/2016 | Kubota | H01L 21/05253 438/522 |
| 2018/0053666 | A1* | 2/2018 | Babayan | H01L 21/67103 |

\* cited by examiner

IN-SITU WAFER TEMPERATURE MEASUREMENT AND CONTROL

REFERENCE TO RELATED APPLICATIONS

This application is a U.S. Non-Provisional Applications which claims the benefit of U.S. Provisional Application Ser. No. 62/650,832 filed Mar. 30, 2018, entitled "IN-SITU WAFER TEMPERATURE MEASUREMENT AND CONTROL", the contents of which are herein incorporated by reference in their entirety.

FIELD

The present disclosure relates generally to workpiece processing systems and methods for processing workpieces, and more specifically to a system and method for precise and accurate control of a temperature of a workpiece on a thermal chuck in an ion implantation system.

BACKGROUND

In semiconductor processing, many operations, such as ion implantation, may be performed on a workpiece or semiconductor wafer. As ion implantation processing technology advances, a variety of ion implantation temperatures at the workpiece can be implemented to achieve various implantation characteristics in the workpiece. For example, in conventional ion implantation processing, three temperature regimes are typically considered: cold implants, where process temperatures at the workpiece are maintained at temperatures below room temperature, hot implants, where process temperatures at the workpiece are maintained at high temperatures typically ranging from 100-600° C., and so-called quasi-room temperature implants, where process temperatures at the workpiece are maintained at temperatures slightly elevated above room temperature, but lower than those used in high temperature implants, with quasi-room temperature implant temperatures typically ranging from 50-100° C.

Hot implants, for example, are becoming more common, whereby the process temperature is typically achieved via a dedicated high temperature electrostatic chuck (ESC), also called a heated chuck. The heated chuck holds or clamps the workpiece to a surface thereof during implantation. A conventional high temperature ESC, for example, comprises a set of heaters embedded under the clamping surface for heating the ESC and workpiece to the process temperature (e.g., 100° C.-600° C.), whereby a gas interface conventionally provides a thermal interface from the clamping surface to the backside of the workpiece. Typically, a high temperature ESC is cooled through radiation of energy to the chamber surfaces in the background.

Chilled ion implantation processes are also common, where conventionally, a room temperature workpiece is placed on a chilled chuck, and the chilled chuck is cooled to a chilled temperature (e.g., a temperature below room temperature), thereby cooling the workpiece. Cooling the chilled chuck provides for a removal of thermal energy imparted into the workpiece from the ion implantation, while further maintaining the chuck and workpiece at the chilled temperature during the implant via the removal of heat through the chilled chuck.

Ion implantation processes are also performed at so-called "quasi-room temperature" (e.g., a temperature slightly elevated above room temperature, such as at 50-60° C., but not as high as a hot ion implantation process), whereby a low-heat chuck (e.g., a chuck configured to heat to a temperature less than 100° C.) has been used to control the temperature of the workpiece during implantation.

SUMMARY

The following presents a simplified summary of the disclosure in order to provide a basic understanding of some aspects of the disclosure. This summary is not an extensive overview of the disclosure. It is intended to neither identify key or critical elements of the invention nor delineate the scope of the invention. Its purpose is to present some concepts of the disclosure in a simplified form as a prelude to the more detailed description that is presented later.

Various exemplified aspects of the disclosure facilitate ion implantation processes for implanting ions into a workpiece. According to one exemplified aspect, an ion implantation system is provided having an ion source configured to form an ion beam, a beamline assembly configured to selectively transport the ion beam, and an end station is configured to accept the ion beam for implantation of the aluminum ions into a workpiece.

In accordance with one exemplified aspect, a thermal chuck system is provided, comprising a thermal chuck apparatus configured to selectively retain a workpiece on a clamping surface thereof. The thermal chuck apparatus, for example, comprises one or more heaters configured to selectively heat the clamping surface, thereby selectively heating the workpiece. A thermal monitoring device is further configured to determine a temperature of a surface of the workpiece when the workpiece resides on the clamping surface, therein defining a measured temperature.

In one example, the surface of the workpiece comprises a backside surface of the workpiece facing the thermal chuck apparatus. A controller is further configured to selectively energize the one or more heaters based on the measured temperature. The selective energizing of the one or more heaters by the controller, for example, selectively controls a thermal output of the one or more heaters based on the measured temperature.

The thermal monitoring device, in accordance with one example, comprises one or more direct contact thermal devices, such as one or more of a thermocouple (TC) and a resistance temperature detector (RTD), configured to directly contact a surface of the workpiece. Each of the one or more direct contact thermal devices, for example, may comprise a respective pair of redundant thermal devices. In another example, each respective pair of redundant thermal devices comprises a primary thermal device configured to measure a primary temperature of the surface of the workpiece and a secondary thermal device configured to measure a secondary temperature of the surface of the workpiece.

The controller, for example, may be further configured to determine an accuracy of the measured temperature based on a comparison of primary temperature and secondary temperature, wherein the controller is further configured to provide a signal when the accuracy of the measured temperature exceeds a predetermined threshold. Each respective pair of redundant thermal devices, for example, may be configured to determine the temperature of the surface of the workpiece at a respective location across the surface of the workpiece.

In another example, the one or more direct contact thermal devices are configured to directly contact the surface of the workpiece at one or more respective locations across the surface of the workpiece, wherein the one or more respective locations across the surface of the workpiece comprise at least a central region of the workpiece and a peripheral region of the workpiece. Alternatively, the one or more locations across the surface of the workpiece comprise a plurality of circumferentially-spaced locations across the surface of the workpiece.

In accordance with another example, the thermal monitoring device comprises one or more non-contact thermal devices configured to determine the temperature of the surface of the workpiece without contacting the surface of the workpiece. The one or more non-contact thermal devices, for example, may comprise one or more of an emissivity detector and a pyrometer.

According to another exemplified aspect, an ion implantation apparatus is further configured to implant ions into the workpiece, thereby selectively inputting heat into the workpiece and increasing the temperature of the surface of the workpiece at a location where the ions are implanted.

The one or more of the respective one or more heaters are associated with said location, wherein the thermal monitoring device is further configured to monitor the temperature of the surface of the workpiece proximate to said location, and wherein the controller is further configured to selectively control an output of the one or more one or more of the respective one or more heaters based on the temperature of the surface of the workpiece at said location.

The above summary is merely intended to give a brief overview of some features of some embodiments of the present disclosure, and other embodiments may comprise additional and/or different features than the ones mentioned above. In particular, this summary is not to be construed to be limiting the scope of the present application. Thus, to the accomplishment of the foregoing and related ends, the disclosure comprises the features hereinafter described and particularly pointed out in the claims. The following description and the annexed drawings set forth in detail certain illustrative embodiments of the disclosure. These embodiments are indicative, however, of a few of the various ways in which the principles of the disclosure may be employed. Other objects, advantages and novel features of the disclosure will become apparent from the following detailed description of the disclosure when considered in conjunction with the drawings.

DETAILED DESCRIPTION

The present invention is directed generally toward workpiece processing systems and apparatuses, and more particularly, to a thermal chuck in an ion implantation system configured to control a temperature of a workpiece. Accordingly, the present invention will now be described with reference to the drawings, wherein like reference numerals may be used to refer to like elements throughout. It should be understood that the description of these aspects are merely illustrative and that they should not be interpreted in a limiting sense. In the following description, for purposes of explanation, numerous specific details are set forth in order to provide a thorough understanding of the present invention. It will be evident to one skilled in the art, however, that the present invention may be practiced without these specific details.

Temperature precision and control are having greater and greater import in semiconductor wafer processing. Systems have been provided to measure and control the temperature of a support on which the workpiece resides (e.g., a temperature of an electrostatic chuck), wherein characterization and analytics of the temperature of the support are utilized to indirectly estimate the temperature of the workpiece. This disclosure presently appreciates that such a reliance on the temperature of the workpiece support, however, can lead to temperature errors during processing of the workpiece.

Figure 1:
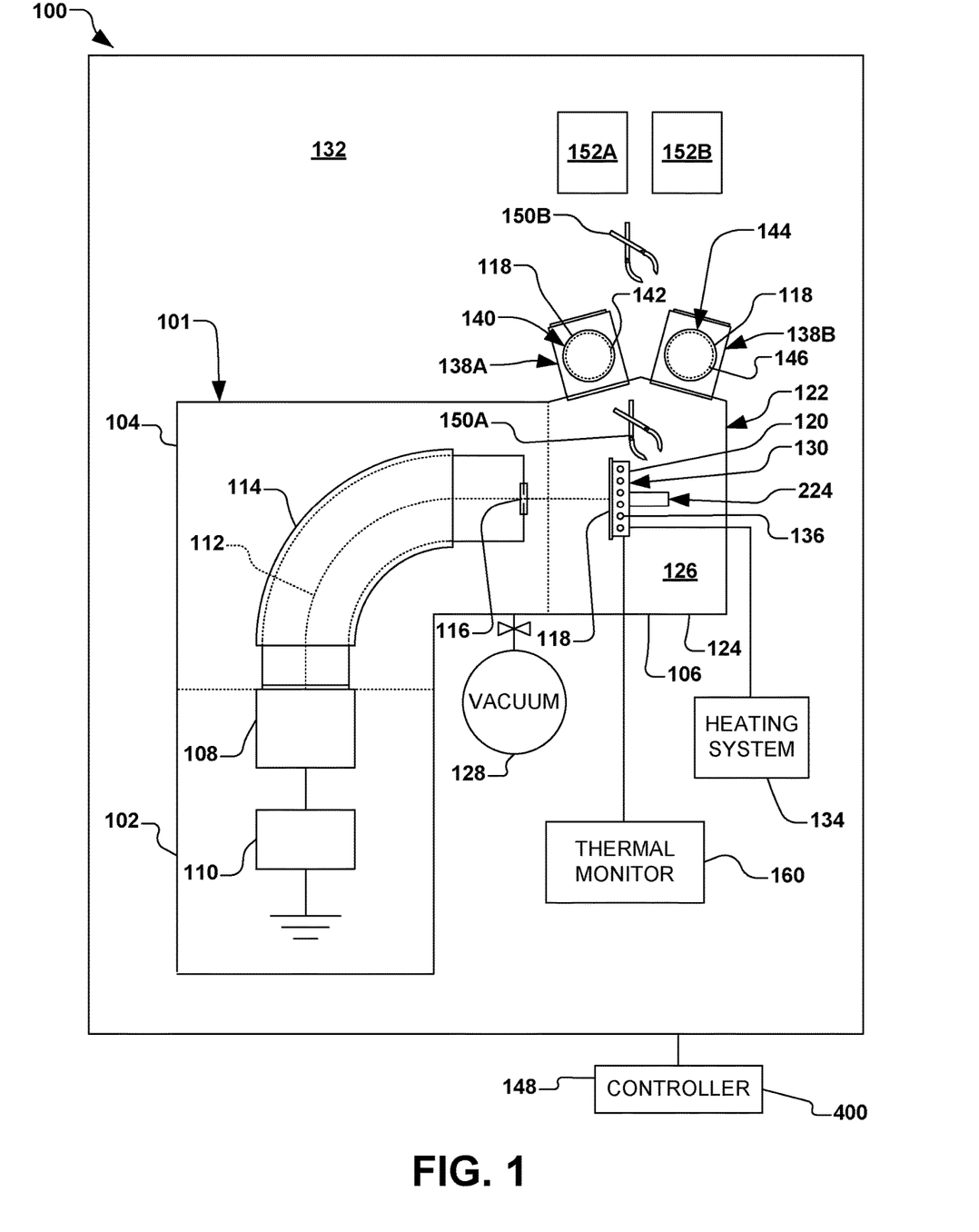
FIG. 1 illustrates a block diagram of an exemplified heated ion implantation system in accordance with an aspect of the present disclosure.

Heated ion implantation processes can heat a workpiece to process temperatures in the range of 100 C-600 C or greater. The process temperature, for example, is, in part, achieved and maintained at an electrostatic chuck that supports the workpiece during implantation. In accordance with various aspects of the present disclosure, FIG. 1 illustrates an exemplified ion implantation system 100. The ion implantation system 100 in the present example comprises an exemplified ion implantation apparatus 101, however various other types of vacuum-based semiconductor processing systems are also contemplated, such as plasma processing systems, or other semiconductor processing systems. The ion implantation apparatus 101, for example, comprises a terminal 102, a beamline assembly 104, and an end station 106.

Generally speaking, an ion source 108 in the terminal 102 is coupled to a power supply 110 to ionize a dopant gas into a plurality of ions and to form an ion beam 112. The ion beam 112 in the present example is directed through a mass analysis apparatus 114, and out an aperture 116 towards the end station 106. In the end station 106, the ion beam 112 bombards a workpiece 118 (e.g., a substrate such as a silicon wafer, a display panel, etc.), which is selectively clamped or mounted to a chuck 120. The chuck 120, for example, may comprise an electrostatic chuck (ESC) or mechanical clamp chuck, wherein the chuck is configured to selectively control a temperature of the workpiece 118. Once embedded into the lattice of the workpiece 118, the implanted ions change the physical and/or chemical properties of the workpiece. Because of this, ion implantation is used in semiconductor device fabrication and in metal finishing, as well as various applications in materials science research.

The ion beam 112 of the present disclosure can take any form, such as a pencil or spot beam, a ribbon beam, a scanned beam, or any other form in which ions are directed toward end station 106, and all such forms are contemplated as falling within the scope of the disclosure.

According to one exemplified aspect, the end station 106 comprises a process chamber 122, such as a vacuum chamber 124, wherein a process environment 126 is associated with the process chamber. The process environment 126 generally exists within the process chamber 122, and in one example, comprises a vacuum produced by a vacuum source 128 (e.g., a vacuum pump) coupled to the process chamber and configured to substantially evacuate the process chamber.

In one example, the ion implantation apparatus 101 is configured to provide a high temperature ion implantation, wherein the workpiece 118 is heated to a process temperature (e.g., approximately 100-600° C. or greater). Thus, in the present example, the chuck 120 comprises a thermal chuck 130, wherein the thermal chuck is configured to support and retain the workpiece 118 while further heating the workpiece 118 within the process chamber 122 prior to, during, and/or after the exposure of the workpiece to the ion beam 112.

The thermal chuck 130, for example, comprises an electrostatic chuck configured to heat the workpiece 118 to a processing temperature that is considerably greater than an ambient or atmospheric temperature of the surroundings or external environment 132 (e.g., also called an "atmospheric environment"). A heating system 134 may be further provided, wherein the heating system is configured to heat the thermal chuck 130 and, in turn, the workpiece 118 residing thereon to the desired processing temperature. The heating system 134, for example, is configured to selectively heat the workpiece 118 via one or more heaters 136 disposed within the thermal chuck 130. The one or more heaters 136, for example, may comprise one or more resistive heating elements. In one alternative, the heating system 134 comprises a radiant heat source, whereby the one or more heaters 136 comprise one or more a halogen lamp, light emitting diode, and infrared thermal device configured to selectively heat the workpiece 118.

For some high temperature implants, the workpiece 118 may allowed to "soak" on the thermal chuck 130 within the vacuum of the process environment 126 until the desired temperature is reached. Alternatively, in order to increase cycle time through the ion implantation system 100 the workpiece may be preheated in one or more chambers 138A, 138B (e.g., one or more load lock chambers) operatively coupled to the process chamber 122 via a pre-heat apparatus 140. The pre-heat apparatus 140, for example, may comprise a pre-heat support 142 configured similar to the thermal chuck 130.

Depending on the tool architecture, process, and desired throughput, the workpiece 118 may be preheated to the first temperature via the pre-heat apparatus 140, wherein the first temperature is equal to or lower than the process temperature, thus allowing for a final thermal equalization on the thermal chuck 130 inside the vacuum chamber 124. Such a scenario allows the workpiece 118 to lose some heat during transfer to the process chamber 122, wherein final heating to the process temperature is performed on the thermal chuck 130. Alternatively, the workpiece 118 may be preheated via the pre-heat apparatus 140 to a first temperature that is higher than the process temperature. Accordingly, the first temperature would be optimized so that cooling of the workpiece 118 during transfer to the process chamber 122 is just enough for the workpiece to be at the desired process temperature as it is clamped onto the thermal chuck 130.

In order to accurately control and/or accelerate the thermal response and enable an additional mechanism for heat transfer, the back side of the workpiece 118 is brought into conductive communication with the thermal chuck 130. This conductive communication is achieved, for example, through a pressure controlled gas interface (also called "back side gas") between the thermal chuck 130 and the workpiece 118. Pressure of the back side gas, for example, is generally limited by the electrostatic force of the thermal chuck 130, and can be generally kept in the range of 5-20 Torr. In one example, the back side gas interface thickness (e.g., the distance between the workpiece 118 and the thermal chuck 130) is controlled on the order of microns (typically 5-20 µm), and as such, the molecular mean free path in this pressure regime becomes large enough for the interface thickness to push the system into the transitional and molecular gas regime.

In accordance with another aspect of the disclosure, chamber 138B comprises a cooling apparatus 144 configured to cool the workpiece when the workpiece 118 is disposed within the chamber 138B subsequent to being implanted with ions during ion implantation. The cooling apparatus 144, for example, may comprise a chilled workpiece support 146, wherein the chilled workpiece support is configured to actively cool the workpiece 118 residing thereon via thermal conduction. The chilled workpiece support 146, for example, comprises a cold plate having a one or more cooling channels passing therethrough, wherein a cooling fluid passing through the cooling channel substantially cools the workpiece 118 residing on a surface of the cold plate. The chilled workpiece support 146 may comprise other cooling mechanisms, such as Peltier coolers or other cooling mechanisms known to one of ordinary skill.

In accordance with another exemplified aspect, a controller 148 is further provided and configured to selectively activate one or more of the heating system 134, the pre-heat apparatus 140, and the cooling apparatus to selectively heat or cool the workpiece 118 respectively residing thereon. The controller 148, for example, may be configured to heat the workpiece 118 in chamber 138A via the pre-heat apparatus 140, to heat the workpiece to a predetermined temperature in the processing chamber 122 via the thermal chuck 130 and heating system 134, to implant ions into the workpiece via the ion implantation apparatus 101, to cool the workpiece in chamber 138B via the cooling apparatus 144, and to selectively transfer the workpiece between the external environment 132 and the process environment 126 via one or more workpiece transfer apparatuses 150A, 150B.

In one example, the workpiece 118 may be further delivered to and from the process chamber 122 such that the workpiece is transferred between a selected front opening unified pod (FOUP) 152A, 152B and chambers 138A, 138B via workpiece transfer apparatus 150B, and further transferred between the chambers 138A, 138B and the thermal chuck 130 via workpiece transfer apparatus 150A. The controller 148, for example, is further configured to selectively transfer the workpiece between the FOUPs 152A, 152B, chambers 138A, 138B, and thermal chuck 130 via a control of the workpiece transfer apparatus 150A, 150B.

The system 100 of FIG. 1 of the present disclosure, for example, may further be advantageously configured to perform both high temperature implants (e.g., in the range of 100-600° C.) and quasi-room temperature implants (e.g., in the range of 20-100° C.) while utilizing the same thermal chuck 130. Such a configuration is advantageous over conventional systems in both simplicity, as well as productivity, as the system 100 of FIG. 1 may be utilized in various implantation schemes with minimal changes in configuration while mitigating various deficiencies commonly seen in conventional startup operations of conventional ion implantation systems.

Figure 2:
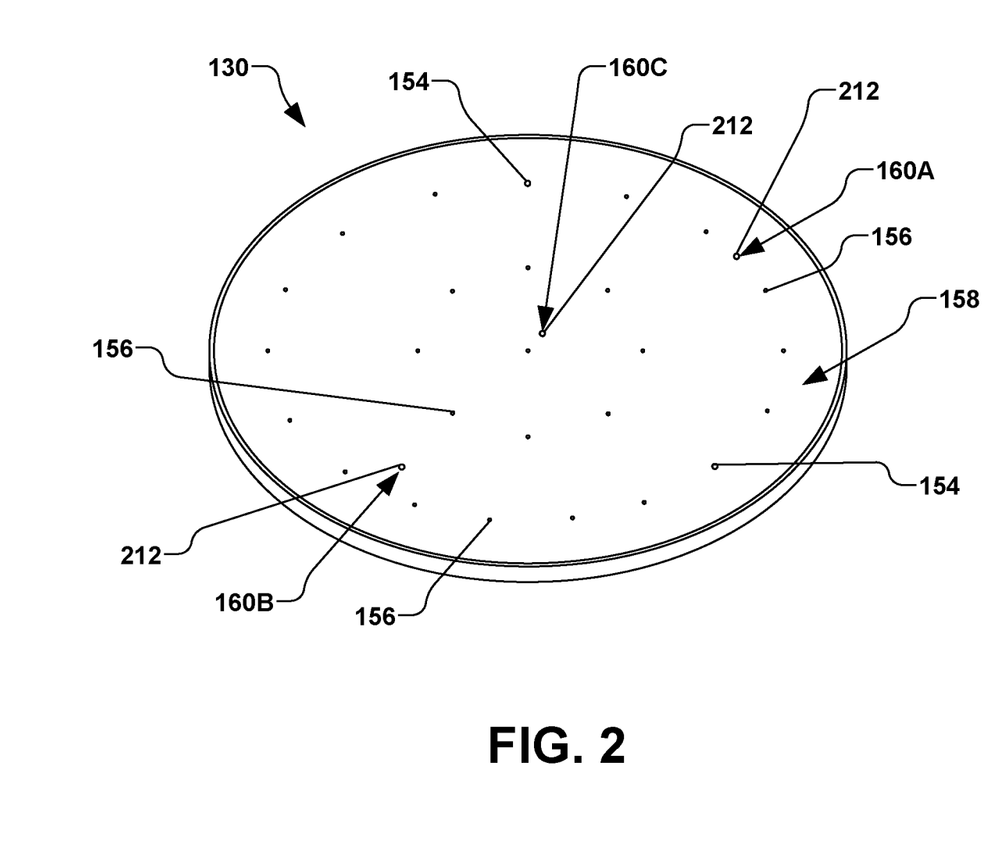
FIG. 2 is a perspective view of a top of a clamping surface of a thermal chuck in accordance with an aspect of the present disclosure.

An exemplified thermal chuck 130 is illustrated in FIG. 2, whereby the thermal chuck, for example, primarily serves two functions; namely, to selectively clamp the workpiece 118 of FIG. 1 thereto, and to heat and/or cool the workpiece. One or more ground pins 154 shown in FIG. 2, for example, are provided for electrical grounding of the workpiece, and a plurality of mesas 156 are provided on a clamping surface 158 of the thermal chuck 130 in order to minimize contact with the workpiece 118 of FIG. 1 and to mitigate particle contamination.

In accordance with one exemplified aspect of the present disclosure, one or more thermal monitoring devices 160A-160C are further provided and configured to determine a temperature of the workpiece 118 of FIG. 1, for example, when the workpiece resides on the clamping surface 158 of FIG. 2, therein defining a measured temperature, as will be discussed in further detail infra. It is noted that, while three thermal monitoring devices 160 are illustrated, any number of thermal monitoring devices, and configurations, thereof, are contemplated as falling within the scope of the present disclosure.

Figure 3:
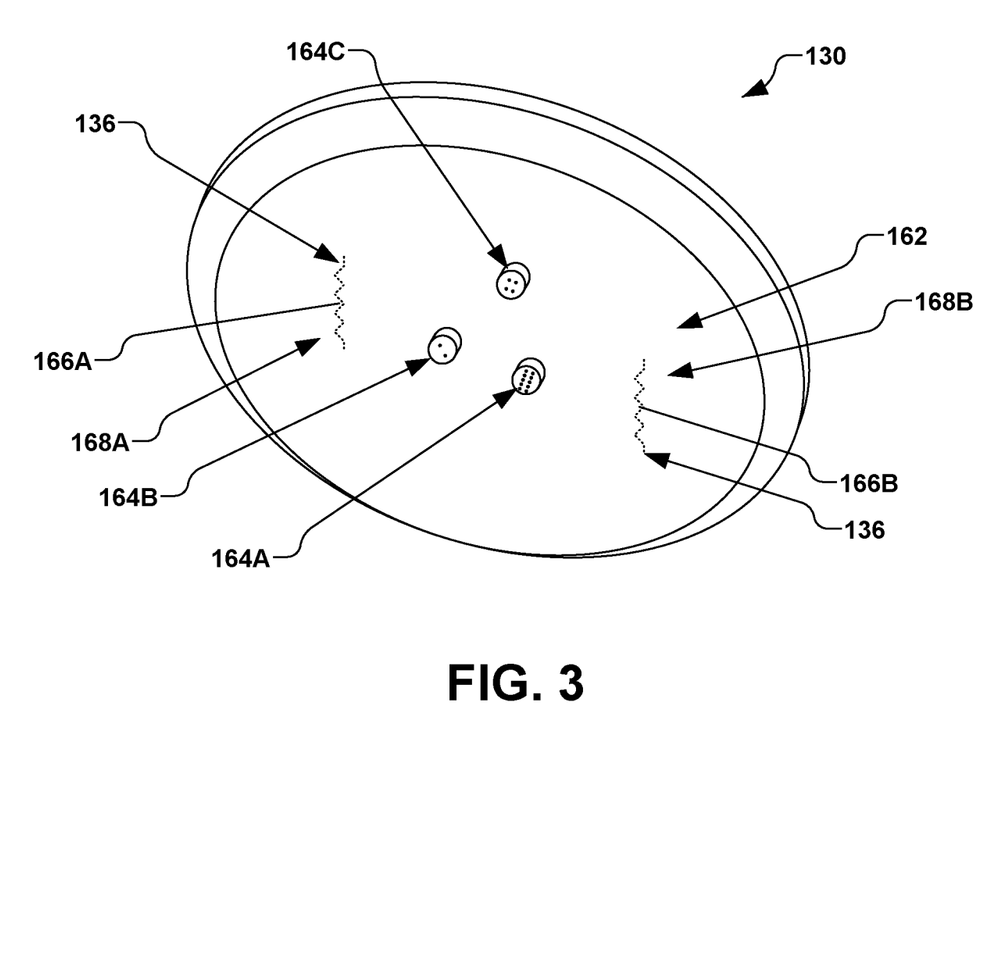
FIG. 3 is a perspective view of a bottom of a thermal chuck in accordance with an aspect of the present disclosure.

FIG. 3, for example, illustrates a backside 162 of the thermal chuck 130 (e.g., an ESC), wherein a plurality of interfaces 164A-164C (e.g., mechanical and/or electrical interfaces) are provided for the thermal chuck. For example, a first interface 164A is provided for high voltage electrostatic electrodes (not shown) configured to electrostatically attract the workpiece to the thermal chuck 130. A second interface 164B is provided for powering one or more heaters 166A, 166B, wherein the controller 148 of FIG. 1 is further configured to selectively energize the one or more heaters of FIG. 3 based on the measured temperature from the one or more thermal monitoring devices 160A-160C of FIG. 2. In the present example, the one or more heaters 136 of FIG. 3 comprise a multi-zone heater (e.g., illustrated as resistive heating elements 166A, 166B) that is embedded in the thermal chuck 130 and configured to selectively heat one or more locations 168A, 168B respectively associated with the one or more heaters. The controller 148, for example, is configured to selectively energize the one or more heaters 136 to selectively control a thermal output of the one or more heaters based on the measured temperature from the respective one or more thermal monitoring devices 160.

In one example, the implantation of ions into the workpiece 118 by the ion implantation apparatus 101 of FIG. 1 selectively inputs heat into the workpiece, thereby increasing the temperature of the surface of the workpiece at a location proximate to where the ions are implanted (e.g., a location of the ion beam 112 striking the workpiece). One or more of the respective one or more heaters 136 of FIG. 3, for example, are associated with said location wherein the thermal monitoring device 160 is further configured to monitor the temperature of a surface of the workpiece 118 proximate to said location, as will be discussed, infra. Accordingly, the controller 148 of FIG. 1 is further configured to selectively control an output of the one or more heaters 166, respectively, based on the temperature of the surface of the workpiece 118 at said location.

While not explicitly illustrated in the schematic shown in FIG. 3, the one or more heaters 136, for example, may be positioned within the thermal chuck 130 to heat the one or more locations 168A, 168B of the thermal chuck, such as one or more of a center region and peripheral region of the thermal chuck, and may be axially and/or radially positioned for a desired heating of the workpiece. A third interface 164C, for example, is further provided for temperature feedback to the controller 148 of FIG. 1 from the one or more thermal monitoring devices 160A-160C associated with the thermal chuck 130 of FIG. 2 for precise and accurate temperature control.

Figure 4:
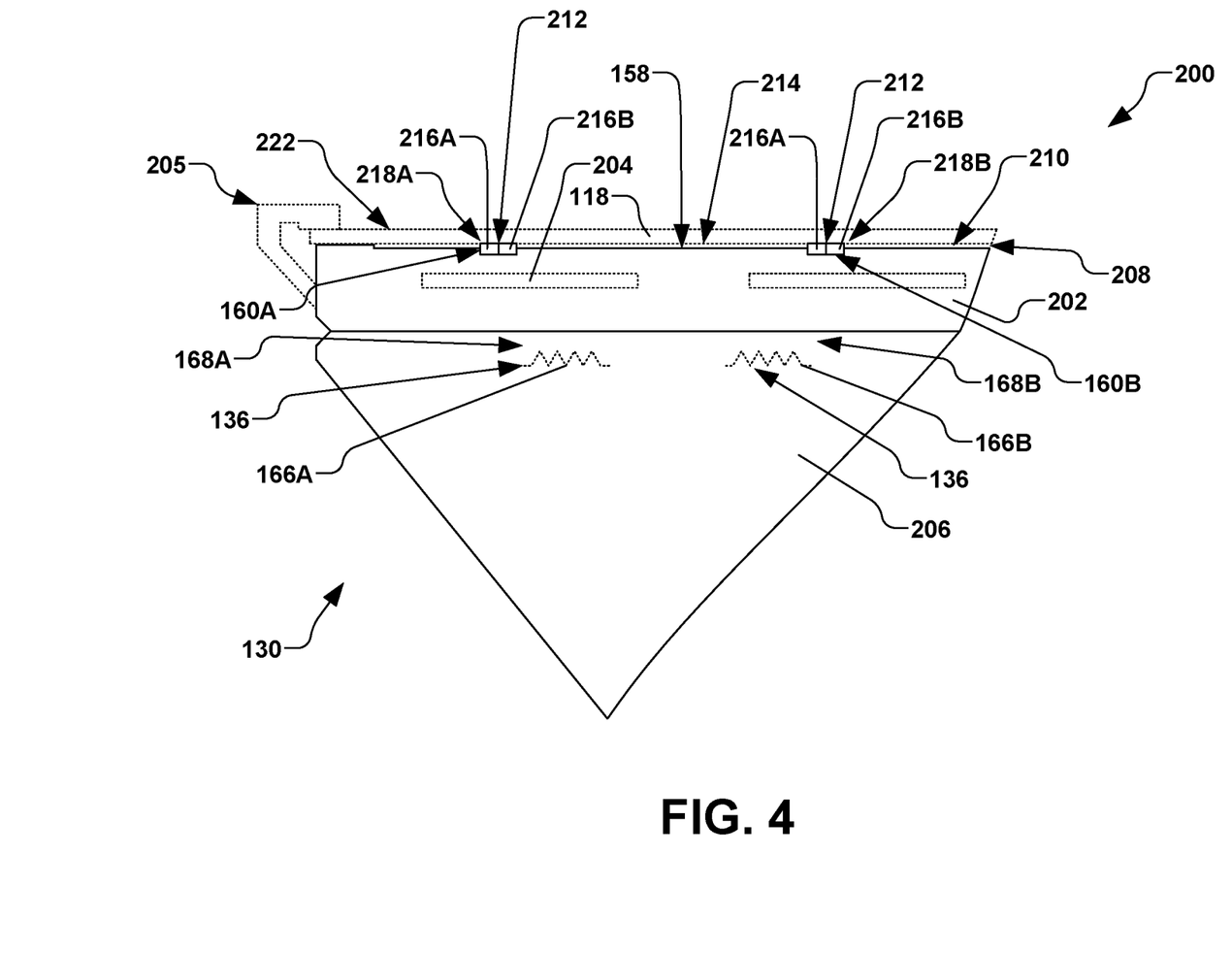
FIG. 4 is a partial cross-sectional view of a thermal chuck in accordance with an aspect of the present disclosure.

In accordance with another exemplified aspect of the disclosure, FIG. 4 illustrates a portion 200 of the thermal chuck 130. For example, a carrier plate 202 is illustrated, whereby the workpiece 118 is selectively clamped to the clamping surface 158 of the thermal chuck 130. In one example, the carrier plate 202 is comprised of a ceramic material having one or more high voltage electrodes 204 embedded therein, or otherwise associated therewith, whereby the one or more high voltage electrodes 204 are configured to electrostatically attract the workpiece 118 to the thermal chuck 130, generally defining an electrostatic chuck (ESC). Alternatively, or in addition, the thermal chuck 130 may comprise one or more mechanical clamping members 205 configured to selectively mechanically clamp the workpiece 118 to the carrier plate 202, whereby the thermal chuck generally defines a mechanical chuck.

The carrier plate 202, for example, may be bonded to or be integral with a heater plate 206 having the one or more heaters 136 (e.g., one or more resistive heating elements 166A, 166B) associated therewith. For example, the heater plate 206 may be comprised of a ceramic material, whereby the one or more heaters 136 are embedded within the heater plate. It should be noted that the heater plate 206 and carrier plate 202 may be separate plates or integrated into one plate. The one or more heaters 136, for example, can be configured to actively heat or maintain the temperature of the workpiece 118 of FIG. 1 during an implantation process. The one or more heaters 136 of FIG. 4, for example, can heat or otherwise maintain the workpiece temperature at 200-500C or various other elevated temperatures, as desired, and may comprise any number or combination of resistive heating elements 166A, 166B, radiative heaters (not shown), or any other heating apparatus configured to heat the workpiece 118. In the present example, the workpiece 118 can be heated via the transfer of heat through the carrier plate 202 to the workpiece.

According to another example, a backside gas (not shown) is provided in a backside gap 208 between the clamping surface 158 of the carrier plate 202 and the workpiece 118 residing thereon in order advantageously transfer heat to or from the workpiece. For example, a backside gas layer 210 is provided in the backside gap 208 (e.g., approximately 10 microns) to conduct heat from the one or more heaters 136 to the workpiece 118 for advantageously providing or maintaining a temperature. Alternatively, in another example, the backside gas layer 210 can conduct heat from the workpiece 118 to the thermal chuck 130 in a cooling mode.

In accordance with one example, the one or more thermal monitoring devices 160A-160C of FIG. 2, for example, comprise one or more direct contact thermal devices 212 illustrated in FIG. 4, wherein the one or more direct contact thermal devices are configured to directly contact a backside surface 214 of the workpiece 118. For example, the one or more direct contact thermal devices 212 of FIG. 4, for example, comprise one or more of a thermocouple (TC) and a resistance temperature detector (RTD). Each of the one or more direct contact thermal devices 212, for example, may have a substantially smooth surface for making contact with a small contact area of the workpiece 118, and may have a thermal mass configured to substantially match the workpiece to eliminate heat sinks or heat transfer therebetween.

The one or more direct contact thermal devices 212, for example, may comprise one or more spring-loaded devices (not shown), such as a spring-loaded TC, whereby the one or more spring-loaded devices are compliant such that the workpiece 118 puts pressure on the one or more spring-loaded devices when placed on the thermal chuck 130, but with a minimal amount of contact pressure.

In one example, each of the one or more direct contact thermal devices 212 comprises a pair of redundant thermal devices 216A, 216B, wherein each pair of redundant thermal devices comprises a primary thermal device (216A) configured to measure a primary temperature of the backside surface 214 of the workpiece 118 and a secondary thermal device (216B) configured to measure a secondary temperature of the backside surface of the workpiece. Accordingly, the controller 148 of FIG. 1 is further configured to determine an accuracy of the measured temperature based on a comparison of primary temperature and secondary temperature. The controller 148, for example, may be further configured to halt a processing of the workpiece 118 when the accuracy of the measured temperature exceeds a predetermined threshold. Each pair of redundant thermal devices 216A, 216B of FIG. 4, for example, may be configured to determine the temperature of the backside surface 214 of the workpiece 118 at a respective location 218A, 218B on the backside surface of the workpiece (e.g., associated with the one or more locations 168A, 168B of the thermal chuck 130).

Figure 5:
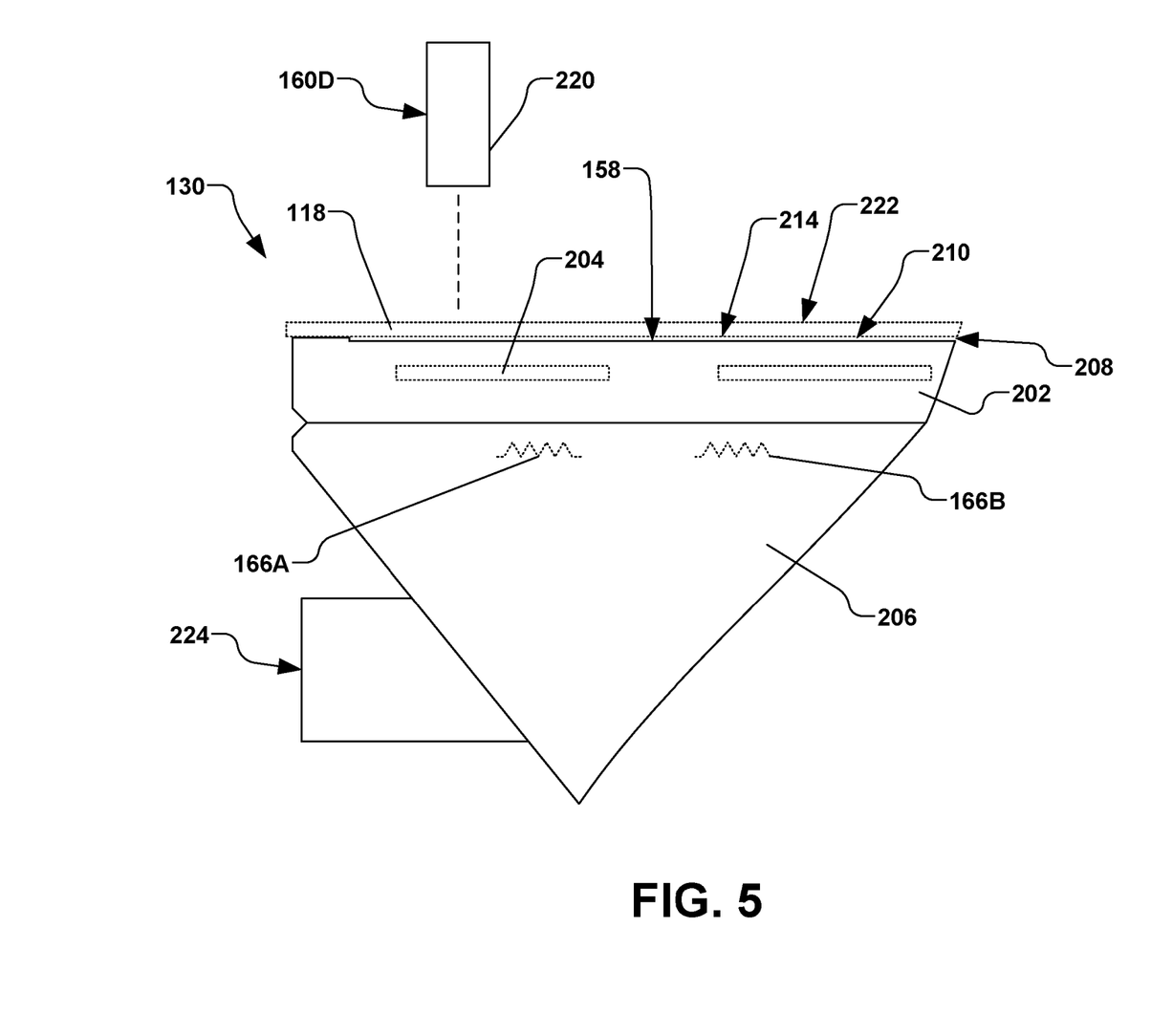
FIG. 5 is a partial cross-sectional view of another thermal chuck in accordance with another aspect of the present disclosure.

In another example, FIG. 5 illustrates an example thermal monitoring devices 160D comprising one or more non-contact thermal devices 220 configured to determine the temperature of the surface (e.g., a top surface 222) of the workpiece 118 without contacting the surface of the workpiece. For example, the one or more non-contact thermal devices 220 comprise one or more of an emissivity detector and a pyrometer configured to determine the temperature of the workpiece 118 without physically contacting the workpiece. The one or more non-contact thermal devices 220 may be positioned proximate to the thermal chuck 130, while being unobtrusive to the processing of the workpiece 118. In one example, a workpiece translation apparatus 224 is configured to selectively translate the thermal chuck 130 (and workpiece 118) in one or more directions. For example, the workpiece translation apparatus 224 may be configured to selectively pass the workpiece 118 through the ion beam 112 of FIG. 1 for ion implantation thereto and/or translate the workpiece proximate to the one or more non-contact thermal devices 220 for determining the temperature, thereof. The workpiece translation apparatus 224, for example, may be configured to selectively translate and/or rotate the workpiece 118 in three dimensions.

For example, the controller 148 of FIG. 1 is further configured to translate the thermal chuck 130 and workpiece 118 to one or more temperature measurement positions via a control of the workpiece translation apparatus 224 of FIG. 5, wherein the one or more non-contact thermal devices 220 are configured to determine the temperature of the surface of the workpiece 118 when the workpiece is at the one or more measurement positions. The one or more non-contact thermal devices 220, for example, may be fixed in space, wherein the one or more measurement positions comprise one or more respective positions and/or angular orientations of the workpiece 118 with respect to the one or more non-contact thermal devices. Alternatively, while not shown, the one or more non-contact thermal devices 220 may be translated to the one or more temperature measurement positions relative to the workpiece 118.

Figure 6:
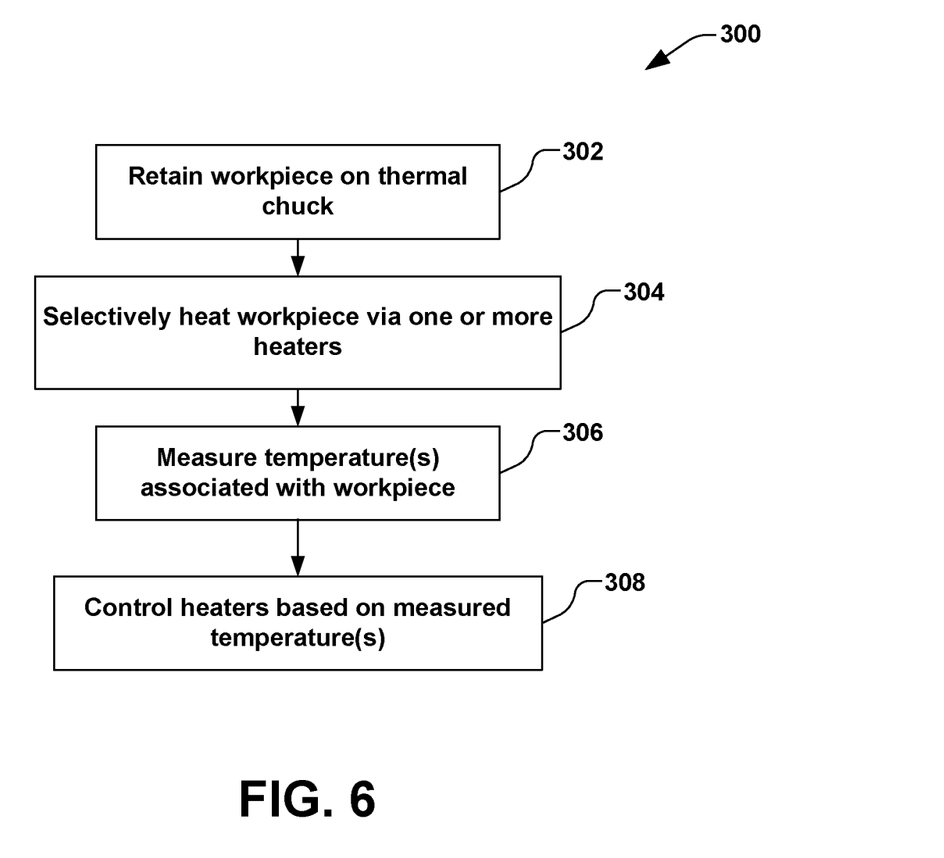
FIG. 6 is a block diagram illustrating an exemplified method for temperature control of a workpiece according to another aspect of the disclosure.

In another aspect of the disclosure, FIG. 6 illustrates a method 300 for controlling a temperature of a workpiece. It should be noted that while exemplified methods are illustrated and described herein as a series of acts or events, it will be appreciated that the present disclosure is not limited by the illustrated ordering of such acts or events, as some steps may occur in different orders and/or concurrently with other steps apart from that shown and described herein, in accordance with the disclosure. In addition, not all illustrated steps may be required to implement a methodology in accordance with the present disclosure. Moreover, it will be appreciated that the methods may be implemented in association with the systems illustrated and described herein as well as in association with other systems not illustrated.

The method 300 shown in FIG. 6, for example, control the temperature of a workpiece positioned on a thermal chuck. In act 302, for example, the workpiece is selectively retained on a clamping surface of the thermal chuck. In act 304, the clamping surface of the thermal chuck is selectively heated by selectively energizing one or more heaters associated with the thermal chuck, thereby selectively heating one or more locations on the workpiece. In act 306, a temperature of a surface of the workpiece is determined when the workpiece resides on the clamping surface of the thermal chuck via a thermal monitoring device, therein defining a measured temperature. The temperature of the workpiece may be determined by directly contacting a surface of the workpiece with a temperature measurement device, by measuring the emissivity or temperature of the workpiece by a non-contact thermal device, or a combination of both. In act 308, the one or more heaters are selectively energized based on the measured temperature, wherein precise and accurate temperature control of the workpiece, itself, is advantageously achieved.

Figure 7:
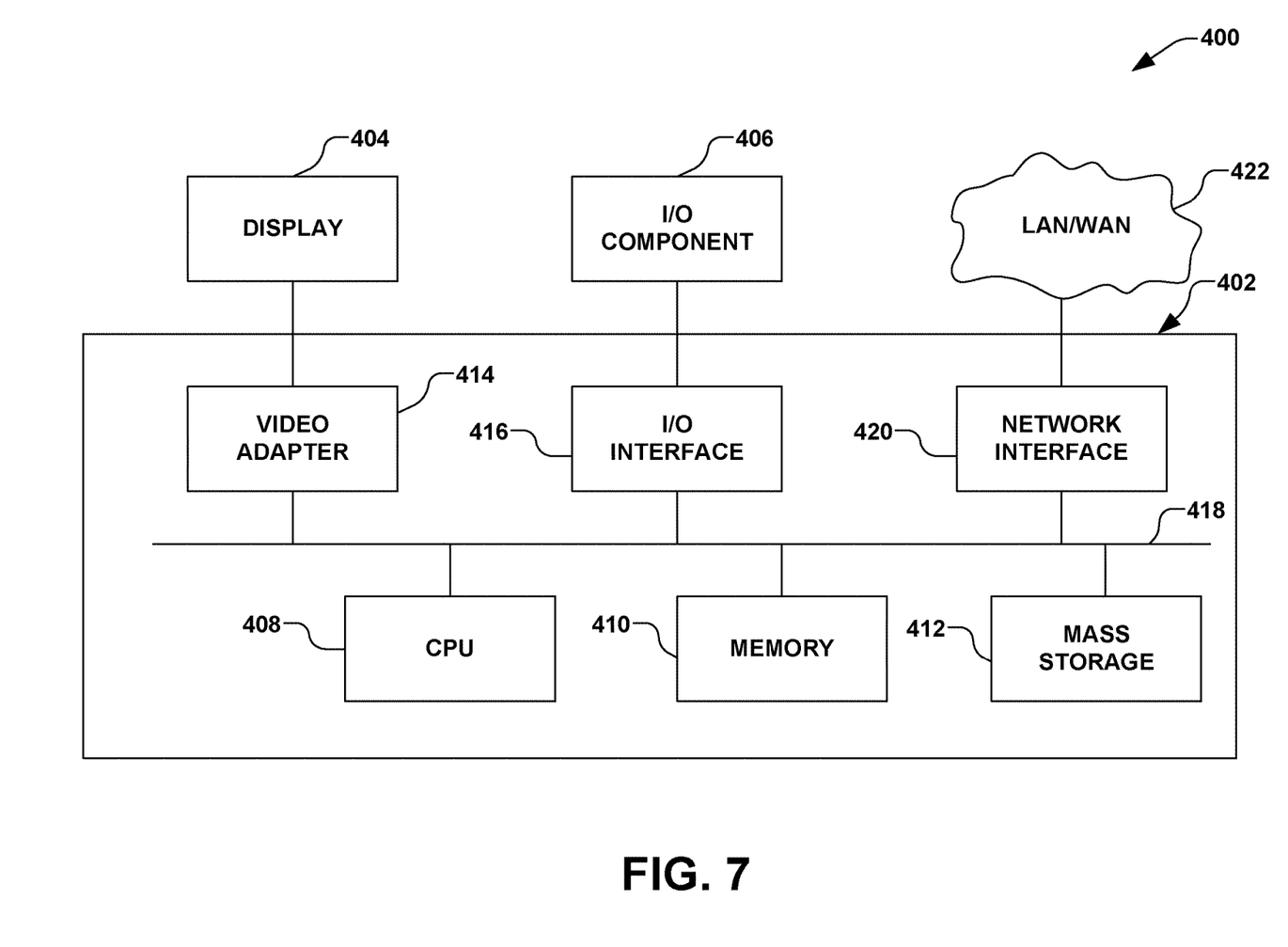
FIG. 7 is a block diagram illustrating an exemplified control system in accordance with another aspect.

In accordance with another aspect, the aforementioned methodology may be implemented using computer program code in one or more of a controller, general purpose computer, or processor based system. As illustrated in FIG. 7, a block diagram is provided of a processor based system 400 in accordance with another embodiment. The processor based system 400 is a general purpose computer platform and may be used to implement processes discussed herein. The processor based system 400 may include a processing unit 402, such as a desktop computer, a workstation, a laptop computer, or a dedicated unit customized for a particular application. The processor based system 400 may be equipped with a display 404 and one or more input/output devices 406, such as a mouse, a keyboard, or printer. The processing unit 402 may include a central processing unit (CPU) 408, memory 410, a mass storage device 412, a video adapter 414, and an I/O interface 416 connected to a bus 418.

The bus 418 may be one or more of any type of several bus architectures including a memory bus or memory controller, a peripheral bus, or video bus. The CPU 408 may include any type of electronic data processor, and the memory 410 may include any type of system memory, such as static random access memory (SRAM), dynamic random access memory (DRAM), or read-only memory (ROM).

The mass storage device 412 may include any type of storage device configured to store data, programs, and other information and to make the data, programs, and other information accessible via the bus 418. The mass storage device 412 may include, for example, one or more of a hard disk drive, a magnetic disk drive, or an optical disk drive.

The video adapter 414 and the I/O interface 416 provide interfaces to couple external input and output devices to the processing unit 402. Examples of input and output devices include the display 404 coupled to the video adapter 414 and the I/O device 406, such as a mouse, keyboard, printer, and the like, coupled to the I/O interface 416. Other devices may be coupled to the processing unit 402, and additional or fewer interface cards may be utilized. For example, a serial interface card (not shown) may be used to provide a serial interface for a printer. The processing unit 402 also may include a network interface 420 that may be a wired link to a local area network (LAN) or a wide area network (WAN) 422 and/or a wireless link.

It should be noted that the processor based system 400 may include other components. For example, the processor based system 400 may include power supplies, cables, a motherboard, removable storage media, cases, and the like. These other components, although not shown, are considered part of the processor based system 400.

Embodiments of the present disclosure may be implemented on the processor based system 400, such as by program code executed by the CPU 408. Various methods according to the above-described embodiments may be implemented by program code. Accordingly, explicit discussion herein is omitted.

Further, it should be noted that various modules and devices in FIGS. 1-5 may be implemented on and controlled by one or more processor based systems 400 of FIG. 7. Communication between the different modules and devices may vary depending upon how the modules are implemented. If the modules are implemented on one processor based system 400, data may be saved in memory 410 or mass storage 412 between the execution of program code for different steps by the CPU 408. The data may then be provided by the CPU 408 accessing the memory 410 or mass storage 412 via bus 418 during the execution of a respective step. If modules are implemented on different processor based systems 400 or if data is to be provided from another storage system, such as a separate database, data can be provided between the systems 400 through I/O interface 416 or network interface 420. Similarly, data provided by the devices or stages may be input into one or more processor based system 400 by the I/O interface 416 or network interface 420. A person having ordinary skill in the art will readily understand other variations and modifications in implementing systems and methods that are contemplated within the scope of varying embodiments.

The present disclosure thus provides precise temperature control of a workpiece undergoing a thermal process, such as the workpiece 118 of FIG. 1 undergoing a high temperature ion implantation, as will now be discussed in greater detail. A temperature sensor or thermal monitoring device 160 (e.g., one or more of a pyrometer, emissivity sensor, TC, RTD or similar device) is implemented to monitor the temperature of the workpiece 118 and to control the thermal chuck 130 (e.g., a heated platen) in order to more accurately and precisely control the temperature of the workpiece concurrent with processing or implantation. The thermal monitoring device 160, for example, provides real-time temperature monitoring of the workpiece 118 and feeds this information into the control system 148, 400 to dynamically control the temperature of the thermal chuck 130 to achieve a specified temperature of the workpiece.

The thermal monitoring device 160, for example, may comprise a non-contact thermal device 220 (e.g., an emissivity sensor) as illustrated in the example shown in FIG. 5, whereby the sensor is integrated into the system 100 of FIG. 1 to provide accurate measurements of the emissivity of the workpiece 118 throughout processing of the workpiece. The emissivity of the workpiece 118, for example, may change as a function of process conditions (e.g., implantation process conditions), the material composition of the workpiece, temperature, and/or any coatings on the workpiece. The emissivity measurement of the present disclosure, for example, may be utilized to feed into other temperature measurements to maintain a more accurate and stable temperature of the workpiece 118. As the temperature of the workpiece 118 changes (e.g., due to implant power, backside gas flow, coolant flow, heater power, etc.) the temperature sensor may be utilized to react to such a change in temperature via the control system 148, 400.

A pyrometer as the thermal monitoring device 160, for example, can be utilized as control feedback in a closed-loop system for providing non-contact temperature measurement and control. Temperature data from the pyrometer may be fed back to the control system 148, 400 to control power input to the one or more heaters 136 of the thermal chuck 130, whereby the control is based on the measured temperature of the workpiece 118. Accordingly, when a change in temperature of the workpiece 118 is measured, the various ones of one or more heaters 136 associated with the thermal chuck 130 may be controlled to compensate for such a temperature change. As such, accurate system control may be achieved by utilizing the actual temperature of the workpiece 118, as opposed conventional measurements of the temperature of the chuck, alone. A pyrometer as the non-contact thermal device 220 of FIG. 5, for example, may be positioned to measure the temperature of the workpiece 118 from the upstream side (e.g., the top surface 222 of the workpiece) that doesn't face the thermal chuck 130. The non-contact thermal device 220 may be alternatively integrated on the thermal chuck 130 such that line-of-sight is provided on the backside surface 214 of the workpiece 118.

In utilizing a thermal monitoring device 160 that contacts the workpiece 118, such as an RTD and/or thermocouple illustrated in FIG. 4, for example, the backside surface 214 of the workpiece may be contacted. However, it is also contemplated that the upstream side or top surface 222 of the workpiece 118 may be contacted by the RTD or TC, or both top surface 222 and backside surface 214 may be contacted. Non-contact thermal devices 220 of FIG. 5, such as pyrometer or emissivity sensors, may be mounted on the side of the process chamber 122 of FIG. 1 (e.g., 1-2 feet away from the workpiece 118). For direct contact thermal devices 212 of FIG. 4, for example, since such devices comprise significantly smaller sensors, contact with the backside surface 214 of the workpiece 118 may be preferable over contact with the top surface 222, but either locations are considered to fall within the scope of the present disclosure.

Multiple locations for the temperature measurement on the workpiece 118 are further contemplated. For example, temperatures may be monitored at several locations around the workpiece for uniformity (e.g., inner and outer zones may be adjusted and controlled for better uniformity). Thus, having multiple thermal monitoring devices 160 at multiple locations advantageously improves uniformity and temperature accuracy.

Furthermore, redundant thermal monitoring devices 160, such as redundant TCs/RTDs, may be implemented in each zone due in order to account for potential high failure rates of the devices. By providing multiple redundant TCs/RTDs, if one fails, the output from the remaining TCs/RTDs may be compared with each other. As such, if a large temperature difference is identified between primary and secondary (e.g., redundant) sensors, such a scenario could be identified as a failure of the TC or RTD, and the system may be placed in a "hold" mode, rather than attempting to drive the heater(s) 136 to match the output of the TC/RTD. Redundant TCs/RTDs, for example, may be positioned close to one another for redundancy, and for uniformity, pairs of TCs/RTDs may be positioned at various locations about the thermal chuck 130. A redundant TC/RTD, for example, may be positioned next to the primary TC/RTD for assessing the "health" of the TC/RTD. In one example, the TCs/RTDs may be positioned 120-180 degrees with respect to one another to provide an understanding of uniformity.

For pyrometric or non-contact thermal sensing, such as illustrated in FIG. 5, the workpiece 118 may be translated to a predetermined position for temperature measurement. The non-contact thermal device 220 (e.g., a pyrometer), for example, may be fixed in space, whereas the workpiece 118 may be retained on the thermal chuck 130 mounted to the workpiece translation apparatus 224, such as a mobile arm. As such, the workpiece 118 may be moved to different positions in order to capture edge, middle, 120 degree offsets, etc. in order to gain a full understanding of temperature uniformity across workpiece. In another example, the workpiece may be rotated in order to capture various angular positions. In some instances, it may be desirable for the pyrometer to be as close to perpendicular to workpiece plane (e.g., less than several inches away from the workpiece 118).

The present disclosure advantageously controls the one or more heaters 136 based on the measured temperature of the workpiece 118, and may be controlled concurrent with ion implantation. For example, a pyrometer may be directed toward the top of a scan length of the ion beam 112 of FIG. 1 (e.g., the workpiece 118 is translated from top to bottom of a particular scan in front of the ion beam). The pyrometer, for example, may thus be configured to retrieve temperature data at the top of each scan. Alternatively, the temperature at a side (e.g., left or right), middle, or other area of the workpiece 118 may be likewise measured.

In one example, a direct contact thermal device 212, such as illustrated in FIG. 4, for example, may be associated with the backside surface 214 of the workpiece 118 and coupled to the thermal chuck 130, whereby continuous temperature monitoring may be achieved throughout an implant. Ion beam power, for example, may change the temperature of the workpiece 118 (e.g., adding power/heat from the ion beam 112 of FIG. 1, which impacts the temperature of the workpiece). The present disclosure thus provides an apparatus and system that captures the change in temperature of the workpiece 118 caused by the ion beam 112 and advantageously measures the temperature of the workpiece, instead of merely measuring the temperature of the thermal chuck 130 on which the workpiece resides. Since the temperature of the thermal chuck 130 is generally decoupled from the temperature of the workpiece 118, the present disclosure provides accurate temperature control, even when ion beam power adds heat to the workpiece, which has not been previously possible using conventional measurement apparatuses that only measure the temperature of a thermal chuck. The present disclosure advantageously monitors the temperature of the workpiece 118, whereby changes in workpiece temperature may be accounted for in modifications to the input power to the one or more heaters 136 in the thermal chuck during the implant.

The one or more direct contact thermal devices 212 of the present disclosure provide accurate and almost immediate measurement data upon beam strike. The one or more direct non-contact thermal devices 220 can likewise provide such near-instantaneous response when the workpiece 118 is in view of the pyrometer, for example. To accomplish temperature monitoring via a pyrometer, each slow scan pass, for example, can be utilized to attain temperature data, as discussed above, whereby the thermal chuck 130 may be accordingly adjusted to control the temperature. The greater the number of passes of the workpiece 118 through the ion beam 112 of FIG. 1, for example, the longer the workpiece is exposed to the ion beam, and the greater changes in temperature can be experienced. Thus, if only a single pass of the workpiece 118 is made in front of the ion beam 112, there will be minimal thermal change due to not spending much time in front of the ion beam. The more passes taken by the workpiece 118 through the ion beam 112, however, the greater the temperature data that is attained, the more likely the temperature is going to change, and the greater the opportunity is provided to control the temperature.

Accordingly, the present disclosure controls the one or more heaters 136 in the thermal chuck 130 based on feedback of the temperature of the workpiece 118. The control of the heating, for example, may be further attained by controlling the one or more heaters, regardless of backside gas flow. The present disclosure thus aids in controlling the temperature of the workpiece 118 independent of beam power, backside gas flow, etc.

While the utilization of a direct contact thermal device such as a TC or RTD and/or a non-contact thermal device such as an emissivity sensor or pyrometer are specifically discussed, any type of sensor configured to directly measure the temperature of the workpiece 118 is contemplated as falling within the scope of the present disclosure.

In yet another example, the present disclosure contemplates that when a workpiece is not present on the thermal chuck 130, the controller 148 of FIG. 1 may be configured to maintain a constant power to the one or more heaters 136. An emissivity sensor, for example, may be thus configured as one of the one or more direct non-contact thermal devices 220 to detect a difference between the workpiece 118 and the thermal chuck 130 to provide such control, as well, such that the temperature of the thermal chuck may be maintained during transfers of workpieces.

Although the disclosure has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplified embodiments of the disclosure. In addition, while a particular feature of the disclosure may have been disclosed with respect to only one of several embodiments, such feature may be combined with one or more other features of the other embodiments as may be desired and advantageous for any given or particular application.

What is claimed is:

1. A thermal chuck system, comprising:
   a thermal chuck apparatus configured to selectively retain a workpiece on a clamping surface thereof in an ion implantation system, wherein the thermal chuck apparatus comprises a plurality of heaters configured to selectively heat the clamping surface, thereby selectively heating the workpiece;
   a thermal monitoring device configured to measure a temperature of a surface of the workpiece when the workpiece resides on the clamping surface, therein defining a measured temperature; and
   a controller configured to selectively energize each of the plurality of heaters based on the measured temperature.

2. The thermal chuck system of claim 1, wherein the thermal monitoring device comprises a plurality of direct contact thermal devices configured to directly contact a surface of the workpiece.

3. The thermal chuck system of claim 2, wherein the plurality of direct contact thermal devices comprise one or more of a thermocouple (TC) and a resistance temperature detector (RTD).

4. The thermal chuck system of claim 2, wherein each of the plurality of direct contact thermal devices comprises a respective pair of redundant thermal devices.

5. The thermal chuck system of claim 4, wherein each respective pair of redundant thermal devices comprises a primary thermal device configured to measure a primary temperature of the surface of the workpiece and a secondary thermal device configured to measure a secondary temperature of the surface of the workpiece, wherein the controller is further configured to determine an accuracy of the measured temperature based on a comparison of primary temperature and secondary temperature, and wherein the controller is further configured to provide a signal when the accuracy of the measured temperature exceeds a predetermined threshold.

6. The thermal chuck system of claim 4, wherein each respective pair of redundant thermal devices are configured to determine the temperature of the surface of the workpiece at a respective location across the surface of the workpiece.

7. The thermal chuck system of claim 2, wherein the plurality of direct contact thermal devices are configured to directly contact the surface of the workpiece at a plurality of respective locations across the surface of the workpiece.

8. The thermal chuck system of claim 7, wherein the plurality of respective locations across the surface of the workpiece comprise at least a central region of the workpiece and a peripheral region of the workpiece.

9. The thermal chuck system of claim 8, wherein the plurality of respective locations across the surface of the workpiece comprise a plurality of circumferentially-spaced locations across the surface of the workpiece.

10. The thermal chuck system of claim 2, wherein the surface of the workpiece comprises a backside surface of the workpiece facing the thermal chuck apparatus.

11. The thermal chuck system of claim 1, wherein the thermal monitoring device comprises one or more non-contact thermal devices configured to determine the temperature of the surface of the workpiece without contacting the surface of the workpiece.

12. The thermal chuck system of claim 11, wherein the one or more non-contact thermal devices comprise one or more of an emissivity detector and a pyrometer.

13. The thermal chuck system of claim 1, wherein the selective energizing of the plurality of heaters by the controller selectively controls a thermal output of the plurality of heaters based on the measured temperature.

14. The thermal chuck system of claim 1, further comprising an ion implantation apparatus configured to implant ions into the workpiece, thereby selectively inputting heat into the workpiece and increasing the temperature of the surface of the workpiece at a location where the ions are implanted, wherein one or more of the plurality of heaters are associated with said location and wherein the thermal monitoring device is further configured to monitor the temperature of the surface of the workpiece proximate to said location, and wherein the controller is further configured to selectively control an output of the respective one or more of the plurality of heaters based on the temperature of the surface of the workpiece at said location.

15. The thermal chuck system of claim 1, wherein the plurality of heaters are embedded within the thermal chuck apparatus.

16. The thermal chuck system of claim 1, wherein each of the plurality of heaters comprise one of a resistive heater and a radiative heater, respectively.

17. A thermal processing system, comprising:
a thermal chuck having a clamping surface configured to support a workpiece thereon in an ion implantation system;
a plurality of heaters configured to selectively heat the workpiece residing on the clamping surface;
a thermal monitoring device configured to measure a temperature of the workpiece when the workpiece resides on the clamping surface, therein defining a measured temperature; and
a controller configured to selectively energize each of the plurality of heaters based on the measured temperature.

18. The thermal processing system of claim 17, wherein thermal monitoring device comprises a plurality of direct contact thermal devices configured to directly contact a surface of the workpiece.

19. The thermal processing system of claim 18, wherein each of the plurality of direct contact thermal devices comprise one or more of a thermocouple (TC) and a resistance temperature detector (RTD).

20. The thermal processing system of claim 17, wherein the thermal monitoring device comprises one or more non-contact thermal devices configured to determine the temperature of a surface of the workpiece without contacting the surface of the workpiece.

21. The thermal processing system of claim 20, wherein the one or more non-contact thermal devices comprise one or more of an emissivity detector and a pyrometer.

22. The thermal processing system of claim 20, further comprising a workpiece translation apparatus configured to selectively translate the thermal chuck and workpiece in one or more directions, wherein the controller is further configured to translate the thermal chuck and workpiece to one or more temperature measurement positions via a control of the workpiece translation apparatus, wherein the one or more non-contact thermal devices are configured to determine the temperature of the surface of the workpiece when the workpiece is at the one or more temperature measurement positions.

23. The thermal processing system of claim 17, further comprising an ion implantation apparatus configured to selectively implant ions into the workpiece.

24. The thermal processing system of claim 17, wherein the thermal chuck comprises one of an electrostatic chuck and a mechanical clamping plate.

25. A thermal monitoring system, comprising:
a thermal chuck having a clamping surface configured to support a workpiece in an ion implantation system;
a plurality of direct contact thermal devices configured to directly contact a backside surface of the workpiece at a respective plurality of locations on the workpiece when the workpiece resides on the clamping surface of the thermal chuck, wherein each of the plurality of direct contact thermal devices is configured to measure a respective temperature of the workpiece at the respective plurality of locations, therein defining a plurality of measured temperatures;
a plurality of heaters respectively associated with the plurality of locations and configured to selectively heat the workpiece proximate to the respective plurality of locations; and a controller configured to selectively energize the plurality of heaters based on the plurality of measured temperatures.

* * * * *